United States Patent
Garnache-Creuillot et al.

(10) Patent No.: US 10,483,720 B2
(45) Date of Patent: Nov. 19, 2019

(54) LASER DEVICE WITH A BEAM CARRYING CONTROLLED ORBITAL ANGULAR MOMENTUM

(71) Applicants: UNIVERSITE DE MONTPELLIER, Montpellier (FR); CENTRE NATIONAL DE LA RECHERCHE SCIENTIFIQUE, Paris (FR)

(72) Inventors: Arnaud Garnache-Creuillot, Montpellier (FR); Mikhael Myara, Sète (FR); Isabelle Sagnes, Paris (FR); Luc Le Gratiet, Sainte-Geneviève-des-Bois (FR); Mohammed Sellahi, Montpellier (FR); Mohammed Seghilani, Montpellier (FR); Philippe Lalanne, Bordeaux (FR)

(73) Assignees: UNIVERSITE DE MONTPELLIER, Montpellier (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 5 days.

(21) Appl. No.: 15/535,528

(22) PCT Filed: Dec. 15, 2015

(86) PCT No.: PCT/EP2015/079853
§ 371 (c)(1),
(2) Date: Jun. 13, 2017

(87) PCT Pub. No.: WO2016/096893
PCT Pub. Date: Jun. 23, 2016

(65) Prior Publication Data
US 2017/0346257 A1    Nov. 30, 2017

(30) Foreign Application Priority Data
Dec. 15, 2014    (EP) .................................... 14307037

(51) Int. Cl.
| H01S 5/183 | (2006.01) |
| H01S 5/14  | (2006.01) |
| H01S 5/10  | (2006.01) |

(52) U.S. Cl.
CPC ............ *H01S 5/18319* (2013.01); *H01S 5/14* (2013.01); *H01S 5/105* (2013.01); *H01S 2301/20* (2013.01); *H01S 2301/203* (2013.01)

(58) Field of Classification Search
CPC ............ H01S 2301/14; H01S 2301/16; H01S 2301/203; H01S 5/18319–18338; H01S 5/14–148
See application file for complete search history.

(56) References Cited

U.S. PATENT DOCUMENTS 4,903,271 A * 2/1990 Yasui ..................... G02B 27/09
                                                 372/103
5,506,858 A * 4/1996 Takenaka ............... B23K 26/06
                                                 372/108
(Continued)

FOREIGN PATENT DOCUMENTS

JP   WO 2005062434 A1 *  7/2005   ............. H01S 5/14
WO   WO 2009004581 A1 *  1/2009   ............. H01S 5/141

OTHER PUBLICATIONS

Xie et al., "Vertical-Cavity Surface-Emitting Laser with a Liquid Crystal External Cavity", Nov. 15, 2014, Optics Letters, vol. 39, No. 22, 6494-6497.*

(Continued)

*Primary Examiner* — Joshua King
(74) *Attorney, Agent, or Firm* — Greer, Burns & Crain, Ltd.

(57) ABSTRACT

A laser device is provided for generating a helical-shaped optical wave and includes: (i) a gain region located between one first end defined by a first mirror and a second end defined by an exit region, (ii) a second mirror arranged so as (Continued)

to form with the first mirror an optical cavity including the gain region and a gap between the exit region and the second mirror, (iii) apparatus for pumping the gain region so as to generate the optical wave, wherein the laser device further includes at least one apparatus for shaping the light intensity and/or phase profiles of the optical wave and arranged for selecting at least one rotary-symmetrical transverse mode of the optical wave, the rotary-symmetrical transverse mode being chosen between those with a radial index equal to zero and with an azimuthal index being an integer with a module higher or equal to 1.

14 Claims, 6 Drawing Sheets

(56) References Cited

U.S. PATENT DOCUMENTS

| | | | |
|---|---|---|---|
| 5,917,848 A | 6/1999 | Claisse et al. | |
| 6,778,582 B1* | 8/2004 | Mooradian | H01S 5/18311 372/20 |
| 6,995,351 B2 | 2/2006 | Curtis et al. | |
| 2002/0141472 A1* | 10/2002 | Koyama | H01S 5/18391 372/96 |
| 2002/0176473 A1* | 11/2002 | Mooradian | H01S 5/142 372/92 |
| 2002/0181536 A1* | 12/2002 | Jeon | H01S 5/18388 372/96 |
| 2004/0228379 A1* | 11/2004 | Cox | H01S 5/18386 372/45.013 |
| 2006/0029120 A1* | 2/2006 | Mooradian | H01S 5/1021 372/102 |
| 2006/0056476 A1* | 3/2006 | Hiiro | H01S 5/18388 372/50.124 |
| 2011/0058579 A1* | 3/2011 | Ohtake | H01S 3/08045 372/19 |
| 2011/0064113 A1* | 3/2011 | Ando | H01S 3/0804 372/99 |
| 2012/0120977 A1* | 5/2012 | Fattal | H01S 5/18363 372/50.11 |
| 2012/0147912 A1* | 6/2012 | Moench | H01S 5/14 372/29.02 |
| 2013/0294467 A1* | 11/2013 | Moloney | H01S 3/10 372/20 |

OTHER PUBLICATIONS

Ruffato et al., "Generation of High-Order Laguerre-Gaussian Modes by Means of Spiral Phase Plates", Sep. 1, 2014, Optics Letters, vol. 39, No. 17, 5094-5097.*

Li et al., "Transverse Modes and Patterns of Electrically Pumped Vertical-Cavity Surface-Emitting Semiconductor Lasers", Aug.-Sep. 1994, Chaos, Solitons & Fractals, vol. 4, issue 8-9, 1619-1636.*

Wichmann et al., Room-Temperature Terahertz Generation Using Vertical-External-Cavity Surface-Emitting Lasers, May 12-16, 2013, Lasers and Electro-Optics Europe.*

Mari et al., "Fabrication and Testing of I=2 Optical Vortex Phase Masks for Coronography", Feb. 1, 2010, Optics Express, vol. 18, No. 3, 2339-2344.*

Ruffato et al., "Spiral Phase Plates for the Generation of High-Order Laguerre-Gaussian Beams with Non-Zero Radial Index", 2015, Proc. SPIE 9379, Complex Light and Optical Forces IX, 937905.*

Paquet et al., "Vertical-External-Cavity Surface-Emitting Laser for THz Generation", Sep. 14-19, 2014, Infrared, Millimeter, and Terahertz waves (IRMMW-THz), 2014 39th International Conference.*

De Colstoun et al., "Transverse Modes, Vortices and Vertical-Cavity Surface-Emitting Lasers" 1994, Chaos, Solitons & Fractals, vol. 4, Nos. 8/9, 1575-1596.*

Scheuer et al., "Optical Vortices Crystals: Spontaneous Generation in Nonlinear Semiconductor Microcavities", Jul. 9, 1999, Science, vol. 285, 230-233.*

Ishaaya et al., "Efficient Selection of High-Order Laguerre-Gaussian Modes in a Q-Switched Nd:YAG Laser", Jan. 2003, IEEE Journal of Quantum Electronics, vol. 39, No. 1, 74-82.*

Bencheikh et al., "Generation of Laguerre-Gaussian LGp0 Beams using Binary Phase Diffractive Optical Elements", Jul. 18, 2014, Applied Optics, vol. 53, No. 21, 4761-4767.*

Otsuka et al., "Spontaneous Generation of Vortex Array Beams from a Thin-Slice Solid-State Laser with Wide-Aperture Laser-Diode Pumping" Jan. 1, 2009, Optics Letters, vol. 34, No. 1, 10-12.*

Sellahi et al., "Coherent High-Order Laguerre-Gauss Modes with a High-Q External-Cavity Semi-Conductor Laser: Standing Wave Radial Pattern and VORTEX," 2nd Workshop VECSEL in Montpellier, France, Oct. 15-17, 2013, pp. 45-46.

Sellahi et al., "Generation of New Spatial and Temporal Coherent States Using VECSEL Technology: VORTEX, High Order Laguerre-Gauss Mode, Continuum Source," Proceedings of SPIE—International Society for Optical Engineering (2014), vol. 8966, pp. 89660U1-89660U7.

Sellahi et al., "Generation of Single Frequency Highly Coherent High-Order Laguerre Gaussian Modes with Vertical-External-Cavity-Surface-Emitting-Laser," Conference on Lasers & Electro-Optics Europe & International Quantum Electronics Conference, May 12, 2013, p. 1.

European Search Report from European Patent Application No. 14307037.3, dated Jul. 2, 2015.

International Search Report from International Patent Application No. PCT/EP2015/079853, dated May 10, 2016.

* cited by examiner

LASER DEVICE WITH A BEAM CARRYING CONTROLLED ORBITAL ANGULAR MOMENTUM

BACKGROUND

The present invention relates to Vertical External Cavity Surface Emitting Laser devices (VeCSEL), and more specifically to the generation of a coherent-single-frequency vortex mode or a bi-frequency vortex mode with such devices.

The field of the invention is, but not limited to, photonic applications, and more precisely optical handling of microscopic particles, atoms manipulation, sub-diffraction microscopy and quantum information processing and communication.

Helically phased beams, also called vortex beams, exhibit a helical wave-front that varies in a corkscrew-like manner along the beam's direction of propagation, with a Poynting vector that follows a spiral trajectory around the beam axis. This behavior is described by an azimuthal phase term $e^{iM\theta}$ in the field expression, where the factor M is known as the topological charge which can be both positive and negative integer value depending on the direction of rotation of the wave-front. This factor also signifies that the phase structure contains M intertwined helices. The transverse intensity profile in such beams looks like a ring of light with dark core at the centre, known as doughnut-shaped modes, and most commonly assumed to belong to the Laguerre-Gaussian or Bessel-Gaussian eigen-modes basis.

Several well-known methods have been developed to generate beams with helical wave-front, summarized into two distinct groups:

The first one consists in manipulating light by using external mode-transforming optics, for example using a pair of cylindrical lenses to transform Hermite-Gaussian modes into desired Laguerre-Gaussian (LG) modes with helical phase structure, or using spatial light modulators or spiral phase plates in order to convert a conventional laser beam with parallel wave-front into an exotic one carrying an Orbital Angular Momentum (OAM), as disclosed in U.S. Pat. No. 6,995,351 B2. However, the inconvenient is inherent to pixilation and non-linearity imperfection in such optics that leads to deterioration of the spatial coherence of the beam and the conversion efficiency. Moreover the power is limited by the damage threshold of the liquid crystals in such devices and beam transformation methods are generally cumbersome and need rigorous optical alignments, which makes the beam quality dependent on the experiment conditions.

The second approach consists in direct generation of the vortex laser beam, i.e. generating the helical wave-front inside the optical cavity by selecting one mode of the $LG_{OM}$ set of modes thanks to modal net gain competition (thanks to spatial hole burning (SHB), a non-linear mode competition process). It is done for example by two orthogonal modes intracavity locking, or by using a ring-shaped pump beam. However, the inconvenient is that both methods need intracavity elements (absorbers, apertures, Brewster window, etalon . . . etc) which leads to a sophisticated alignment procedure and affect the spatial coherence of the beam. Furthermore, the selection of the wave-front direction of rotation is either not definite or understood.

The aim of the present invention is to fulfil the previously mentioned problems and further to lead to some other advantages.

It is an object of the invention to provide direct laser generation of high coherence rotary-symmetrical transverse modes.

It is another object of the present invention to provide laser sources carrying an Orbital Angular Momentum with controlled charge and sign.

It is another object of the invention to provide stable, robust and controlled lasing effect of a single vortex mode.

It is another object of the present invention to provide laser sources achieving high-power operations.

It is another object of the invention to provide laser sources with an integrated device.

It is another object of the invention to reduce costs for fabricating such devices.

SUMMARY

Such objects are accomplished with a laser device for generating a helical-shaped phase optical wave and comprising (i) a gain region located between one first end defined by a first mirror and a second end defined by an exit region, (ii) a second mirror, arranged so as to form with the first mirror an optical cavity (composed for example of free space, bulk material or optical guide(s))including the gain region and a gap between the exit region and the second mirror and (iii) means for pumping the gain region so as to generate the optical wave. The laser device according to the invention further comprises at least one means for shaping the light intensity and/or phase profiles of the optical wave and arranged for selecting at least one rotary-symmetrical transverse mode of the optical wave, said rotary-symmetrical transverse mode being chosen between those with a radial index equal to zero and with an azimuthal index being an integer with a module higher or equal to 1

Thus it is possible thanks to the device according to the invention to control the charge and the sign of the OAM in a plano-concave laser cavity by slightly perturbing the rotary-symmetrical transverse eigenbasis—to break the counter-clockwise mode symmetry and lift the optical frequency degeneracy—in such a manner that the mode with undesired OAM sign is strongly altered, without significantly affecting the desired one, making the laser resonator more favourable to sustain the latter, through for example mode interaction and competition in the gain region or injection locking with an external source. Thus it is an advantage of the invention to select some particular rotary-symmetrical transverse modes that enable a vortex lasing: it provides direct laser generation of high coherence.

In a preferred embodiment, the selected rotary-symmetrical transverse modes are chosen in the Laguerre-Gauss (LG) or Bessel-Gauss (BG) eighenbasis. The azimuthal index may be chosen as a non-integer but it would lead to a non-optimal operating mode.

Thus the present invention consists in selecting some very specific transverse modes while both the Laguerre-Gauss and Bessel-Gauss basis include lot of transverse modes. Those that lead to an optical wave carrying an orbital angular momentum are very specific and not easy to isolate. The present invention aims firstly at selecting those transverse modes that generate a beam carrying an orbital angular momentum and secondly at controlling its sign and its charge. As disclosed in the previous art, it is an issue to predictively control the sign and the charge of the optical wave angular momentum; many solutions have been tested without some good results in terms of repeatability and reproducibility.

The device according to the invention comprises any type of laser. In a preferred embodiment, the laser device according to the invention may comprise any type of disk lasers, as for example a Vertical External Cavity Surface Emitting Laser, but it may also be compliant with Diode Pump Solid State Lasers (DPSSL), Dye Lasers, Gas Laser.

Thus, the laser device according to the invention provides a simplified design, without the need of extra-elements or additional beam shaping optics, and it is suitable for high-power operations with good coherence and good stability.

The device according to the invention comprises any type of optical cavity. In a preferred embodiment, said optical cavity may be composed with at least one optical fibre with one cleaved end and comprising over at least a part of its length a gain region.

According to one another mode of realization, the at least one means for shaping the light intensity and/or phase profiles of the optical wave may consist in at least one means for transverse filtering said optical wave.

According to one another mode of realization, the at least one means for transverse filtering the optical wave may be centred on a centre-longitudinal axis.

According to one another mode of realization, the at least one means for transverse filtering the optical wave may comprise at least one of the following functionalized areas:
- a center-discoidal area providing high optical losses between a minimum phase shift value and a maximum phase shift value, and/or
- a first annular area, located around the center-discoidal area and providing azimuthal graded phase shift $\Delta m$ per cavity round trip.

For example, the phase shift between the two areas of the center-discoidal area may be of the order of $\pi/4$.

The losses induced by the center-discoidal area may be provided by any type of structure, as for example an absorbing structure, a diffusing structure or a diffracting structure. Such structures may provide some local losses in order to attenuate the fundamental lasing mode.

The phase shift $\Delta m$ induced by the annular area may be of any type that is able to generate an azimuthal de-phasing on the optical wave that is oscillating inside the optical cavity. In a preferred embodiment, the annular area is made with a diffractive material as it will be described hereafter.

Thus, it is possible to introduce some weak perturbation in the optical laser cavity and thus to control the phase shifting of the lasing wave-front inside the optical cavity in order to provide an Orbital Angular Momentum. The charge and the sign of the orbital angular momentum are controlled by tuning the dimensional and optical characteristics of the at least one means for transverse filtering the optical wave. More precisely, each one of the areas defined herebefore implements one distinct function for the vortex lasing emission:

The center-discoidal area implements an abrupt phase step in order to provide high diffraction losses at the centre of the mask, used to select a given vortex "doughnut mode" by putting this phase step in the dark region of this mode. Thus, all the lasing modes except the desired one experience high diffraction losses. It also permits to control the charge of the vortex mode by controlling the center-discoidal area diameter. The higher is the diameter, the bigger the dark core of vortex "doughnut modes" is, and thus the larger is the OAM charge.

The annular area introduces a phase-perturbation in order to control the direction of rotation of the vortex mode, i.e., the sign of OAM.

In a preferred embodiment, in a device according to the invention, the at least on means for transverse filtering the optical wave may further comprise at least one more annular area located around the first annular area and providing modal azimuthal graded phase shift. Thus it is possible to simply control the direction of rotation of the wave front that by adjusting the diameter of the optical wave—i.e., the beam waist—that is oscillating inside the optical cavity. The beam waist can be simply control by adjusting the beam cavity length and/or the radius of curvature of the optics (mirrors, lenses) for example.

In a preferred embodiment, the at least one means for transverse filtering the optical wave may further comprise an additional functionalized outer area that generate gain (through pumping) and/or losses (thanks to absorption, diffusion, diffraction) and located on the peripheral region. In a preferred embodiment, the additional functionalized absorbing area is located outer from the annular area. This additional functionalized outer area aims at filtering the optical wave that is oscillating inside the optical cavity in order to limit its external diameter and select the desired mode.

Thus it is possible to select more precisely the rotary-symmetrical transverse modes that enable the vortex lasing effect, by providing sufficient attenuation along the over undesired higher order transverse modes.

In some other mode of realization, the center-discoidal area may be divided onto two sub-areas, the first sub-area providing the minimum phase shift value, and the second sub-area providing the maximum phase shift value, said center-discoidal area providing modal losses. Preferentially, the two sub-areas are equal, i.e., each covers 50% of the center-discoidal area in order to provide maximum losses onto the fundamental lasing mode. Nevertheless, in some other mode of realisation, one of the two sub-areas may be smaller than the other.

In some other mode of realization, the annular area may provide at least one graduated perturbative spiral phase shift $\Delta m$ between the minimum phase shift value and the maximum phase shift value for at most one turn and for one roundtrip of the optical wave in the optical cavity, said annular area providing a modal phase shift comprised between $2\pi^* 1 \times 10^{-5}$ and $2\pi/5$. The phase shift value may be obtained with at least one means for transverse filtering.

In some other mode of realization, the maximum phase shift value $\Delta m$ may be negligible regarding $2\pi$, and for example, it may be smaller than $\Delta m=2\pi/5$ in order to not disturb too much the optical wave that is oscillating inside the optical cavity. The purpose is only to introduce a small perturbative effect in order to break the counter-clockwise mode symmetry and to lift the degeneracy (optical frequency splitting) of vortex modes with same charge but opposite rotation direction.

In some other mode of realization, the minimum phase shift value may be equal to 0 and the maximum phase shift value may be equal to $2\pi/100$ radians. In a more general way, the phase shifts values aim at perturbing the cavity eigenmodes. Thus, it is necessary to introduce some light perturbations with some weak phase difference. The maximum value may be of the order of few percent of $2\pi$ radians, depending on the cavity finesse. Typically, the resultant phase shift in the modal beam azimuthal phase may be comprised between $2\pi \times 1 \cdot 10^{-5}$ and $2\pi/5$ per round trip.

Thus the resultant modal phase shift is proportional to $\Gamma_{xy} \times \Delta m$, where $\Gamma_{xy}$ is the overlapping factor between the beam and the Spiral Phase Element (SPE) provided by the annular area, given by:

$$\Gamma_{xy} = \iint_S |U_n(x,y)|^2 U_{SPE}(x,y) dS$$

Where $U_n(x,y)$ is the transverse distribution of the optical cavity mode field and $U_{SPE}$ is the surface distribution function of the Spiral Phase Element.

As one wants that the modal phase shift $\Gamma_{xy} \times \Delta m$ to be significantly lower than $2\pi$, with a more precise definition, it may be possible to use that the resultant optical frequency splitting of the two contra-rotating VORTEX mode is greater than a fraction of the optical cavity frequency cut off, corresponding to Free Spectral Range/Finess.

In some other embodiments, the azimuthal phase perturbation provided by the Spiral Phase Element may be monotone, from a minimum and to a maximum.

In some other embodiments, the azimuthal phase perturbation provided by the Spiral Phase Element may be linear between a minimum value at a first azimuthal position (for example 0 radian) and a maximum value at a second azimuthal position (for example $2\pi$ radians).

In some other embodiments, the maximum value of the azimuthal phase perturbation provided by the Spiral Phase Element may be reached before one turn ($2\pi$ radians).

In some other embodiments, the azimuthal phase perturbation provided by the Spiral Phase Element may be non-monotone and constituted with more than two extrema in one turn ($2\pi$ radians).

In some other embodiments, the azimuthal perturbation provided by the Spiral Phase Element may be constituted with some linear parts with different kind of slope and/or sign, as for example a sawteeth signal.

According to one another mode of realization, the at least one means for transverse filtering may consist in one single mask located at or close to one of the following location: (i) an antinode of the optical wave, (ii) onto the gain region, (iii) onto the second mirror surface.

In one another mode of realization, the at least one means for transverse filtering may consist in a plurality of masks patterned with at least one functionalized area and at least one of the plurality of masks is located at or close to an antinode of the optical wave.

In a preferred embodiment, the at least one means for transverse filtering may consist in at least on subwavelength-thick mask in order to reduce the diffraction losses along the desired mode and to be selective with the undesired modes.

In a preferred embodiment, the at least one means for transverse filtering the optical wave may be a flat photonic element. Thus the realization of such a structure and its integration—especially its centring along the longitudinal axis—inside the optical cavity are facilitated.

In a preferred embodiment, the at least one means for transverse filtering the optical wave may be located near to an antinode of the optical wave in order to introduce such a weak phase difference with good accuracy In one another preferred embodiment, the phase shifts of the center-discoidal area and/or the annular area may be provided by refractive index variations of the at least one means for transverse filtering the optical wave.

In one another preferred embodiment, the phase shift values of said center-discoidal area and said annular area may be provided by controlling the 2D grating dimensional characteristics of the at least one means for transverse filtering the optical wave.

Thus, the 2D grating of the at least one means for transverse filtering act as a metamaterial with a refractive index equal to the normalized propagation constant of fundamental Bloch mode. Thus, its refractive index can be further controlled trough a careful control of the 2D grating dimensional characteristics, as for example the hole diameters and the distance between two holes. Indeed, tiny air holes correspond to a dense artificial dielectric with a large effective index, whereas large hole areas implement low refractive-index artificial dielectrics.

As a non-restrictive example, for 2D subwavelength grating made with photonic crystal, the grating structural period may be comprised between 0 and the minimum value between $\lambda/n_{grat}$ and $\lambda/n_{sub}$, where $n_{sub}$ is the substrate layer's refractive index on which the photonic crystal in deposited, and $n_{grat}$ is the one of the 2D grating; and the hole diameter must be comprised between 0 and the grating structural period previously defined.

In a preferred embodiment, the flat photonic element according to the invention may be fabricated using III-V semiconductor technology or thanks to a semiconductor material, a dielectric material, an organic material or a metallic material as long as the real part of the optical index is varied along the longitudinal axis of rotation. Thus it makes it very compact and very easy to integrate inside the laser cavity, securing the symmetry requirements and then contributing to provide a robust laser device.

According to another mode of realization of the present invention, the means for pumping the gain region may comprise (i) a pump laser emitting a pumping laser beam and (ii) means arranged for spatially shaping the pumping laser beam intensity. According to the invention, the at least one means for shaping the light intensity and/or phase profiles of the optical wave at least two transverse modes of the optical wave may comprise the means for spatially shaping the pumping laser beam intensity and may be arranged in order to project a pumping beam intensity pattern onto the exit region corresponding with the at least one selected rotary-symmetrical transverse mode of the optical wave.

Thus it is possible to optically pump the rotary-symmetrical transverse modes of the optical wave that is oscillating inside the optical cavity. The other modes are not pumped. Thus only the rotary-symmetrical transverse modes are magnified and, thus, selected. It is an aspect of the invention that the shape of the pumping laser beam is compliant with those modes. In some other terms, the intensity of the pumping beam may be shaped as the intensity transverse profile of the optical wave that is sought inside the optical cavity. To reach this objective, the pumping laser may be equipped with some spatial filter for example in order to shape its intensity.

In a preferred embodiment, the pumping beam intensity pattern projected by the pumping laser onto the exit region may be "doughnut" shaped.

According to one another mode of realization, the means for pumping the gain region may consist in an electrical pumping of the gain region.

According to one another mode of realization, the second mirror may be a concave mirror, a conical mirror or an aspherical mirror.

According to one another mode of realization, the laser device may further comprise at least one cylindrical or spherical intracavity lense and the second mirror may be a flat end mirror.

According to one another mode of realization, the device of the present invention may further comprise at least one means for actively control the longitudinal optical length of the cavity and/or the azimuthal optical path difference of the cavity in order to actively control the charge and/or the sign of the orbital angular momentum.

In a preferred embodiment, the at least one means for actively control the longitudinal optical length and/or the azimuthal optical path difference of the cavity may be mechanical and/or thermal and/or electrical.

In a preferred embodiment, the at least one means for actively control the longitudinal optical length of the cavity may be an actuator designed for moving the second mirror so as to change the length of the optical cavity.

According to one another mode of realization, the device of the present invention may further comprise at least one wide bandwidth spectral filter in order to in order to select another longitudinal mode in order to provide single vortex mode with multi-frequencies.

It's an another aspect of the invention to propose a method for generating a helical-shaped phase optical wave comprising at least one of the following steps: (i) generating an optical wave inside a gain region, said optical wave oscillating inside an optical cavity, (ii) pumping the optical wave with means for pumping, (iii) shaping the light intensity and/or phase profiles of the optical wave for selecting at least one rotary-symmetrical transverse mode of the optical wave between those with a radial index equal to zero and with an azimuthal index being an integer with a module higher or equal to 1.

BRIEF DESCRIPTION OF THE DRAWINGS

The methods and the devices according to embodiments of the present invention may be better understood with reference to the drawings, which are given for illustrative purposes only and not meant to be limiting. Other aspects, goals and advantages of the invention shall be apparent from the description given hereunder.

While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

DETAILED DESCRIPTION

Hereafter, the adjectives "longitudinal" and "azimuthal" refer to the direction that corresponds with the one of the optical wave propagation or the cavity axis, while the adjectives "transverse" and "radial" refer to an orthogonal direction to the longitudinal one.

The adjective "azimuthal" refers to an angle measured onto a transverse plane and obtained by a given rotation along the longitudinal axis.

In the following descriptions, the first element 200 is considered to be a semiconductor element, without limiting the present invention.

As described hereinbefore, the present invention aims at selecting the rotary-symmetrical transverse modes of the optical wave that is oscillating inside the optical cavity. One of those modes are the Laguerre-Gauss with a radial index equal to 0 and an azimuthal index being a non-null integer. It may be both positive and negative. In one another embodiment, it may be also a non-integer value, corresponding with a non-perfect selection of the eigenmode.

Figure 1:
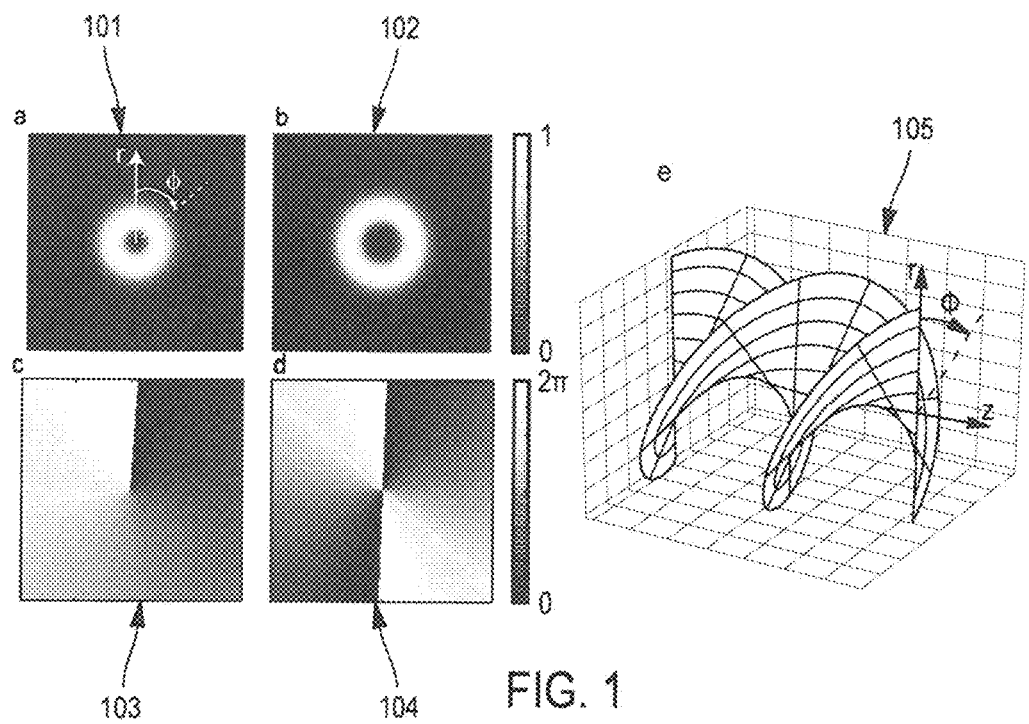
FIG. 1 describes the transverse intensity and phase profiles of $LG_{01}$ and $LG_{02}$ modes of a laser according to the invention.

FIG. 1 illustrates both the transverse intensity and the phase profiles of $LG_{01}$ and $LG_{02}$ modes of a laser according to the invention. The diagrams 101 and 103 illustrate respectively the intensity and the phase profiles of the $LG_{01}$ mode, while the diagrams 102 and 103 illustrate respectively the intensity and the phase profiles of the $LG_{02}$ mode. Those diagrams are plotted along a transverse plane.

The intensity profiles illustrated in 101 and 102 exhibit a "doughnut-shape": the center is dark, as there is no light emission, and encircled with a ring of light, whose intensity profile is of Gaussian type. Moreover, the higher is the topological charge M, the bigger is the inner diameter of the dark core.

It will be described hereafter that the diameter of the inner center-discoid area is defined accordingly to the sought topological charge M for the desired helical mode.

The diagram 105 illustrates a schematic representation of the helical wave-front of a vortex beam with a topological charge M=1, and more precisely the propagation of a constant-phase plane along the longitudinal axis z.

As disclosed hereinabove, the present invention may be carried out with at least two modes of realization described hereafter:

the first mode of realization implements at least one means for filtering the optical wave, and the second mode of realization implement a non-homogeneous optical pumping in order to magnify selectively the desired rotary-symmetrical transverse modes.

First Mode of Realization

Figure 2:
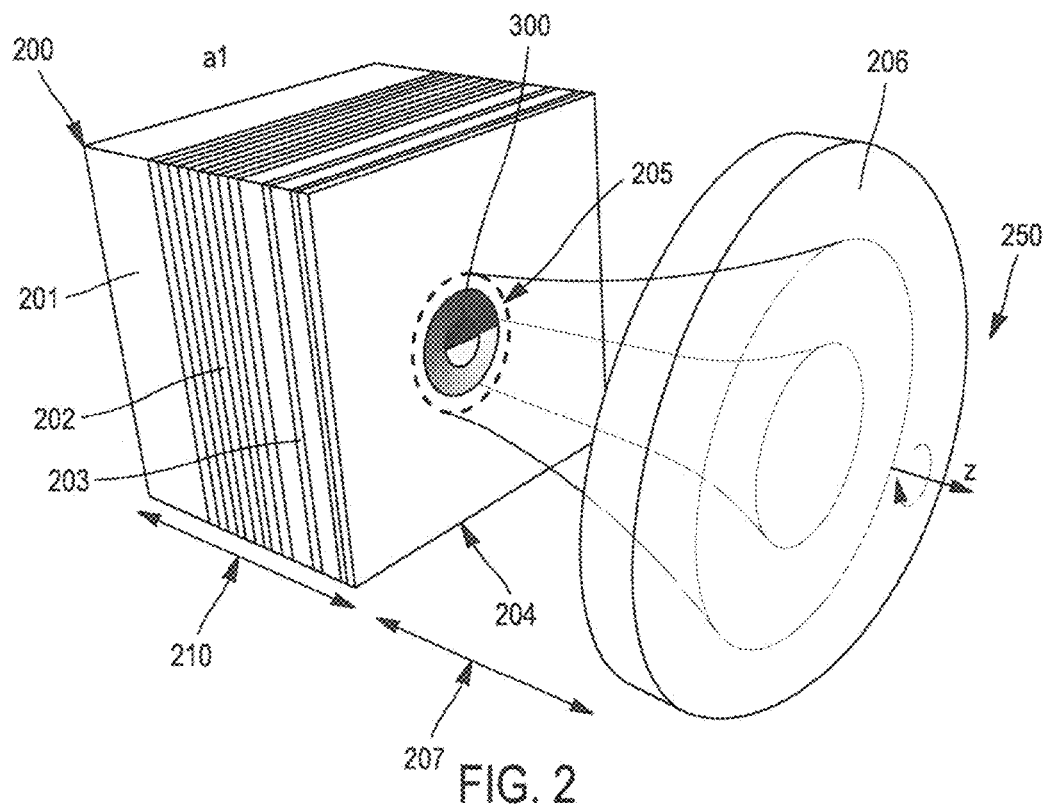
FIG. 2 describes a schematic view of a laser device emitting a vortex laser beam according to the invention.

With reference to FIG. 2, a first mode of realization of the present invention is described. This mode allows stable and compact laser modules, with robust and stabilized single-frequency helical mode.

In a preferred embodiment, the present invention is based on a well-known VeCSEL and integrates functionalities using III-V technologies and external concave-type optical cavity. Nevertheless, the present invention aims at protecting every kind of laser sources that are suitable for the aforesaid applications and the hereafter embodiments.

VeCSEL technology comprises basically a semiconductor element 200 with a gain medium 203 for generating the optical radiation and a first mirror 210. The gain medium 203 may comprise for instance quantum wells or quantum dots and it may be electrically or optically pumped. The first mirror 210 may comprise a succession of layers constituting a Bragg grating 202 which reflects the optical waves. In a preferred embodiment, the semiconductor element 200 may be mounted on a heat sink with Pelletier modules (non-represented) for stabilizing and controlling the temperature.

The Bragg mirror 202 has a high reflectivity, higher than 99% or greater than the output mirror; for example it may be constituted with 31.5 pairs of AlAs/GaAs quarter wave layers.

The gain region 203 is, for example, made with twelve strain-balanced InGaAs/GaAs(P) Quantum Wells located at the anti-node of the laser field in the cavity, with an inhomogeneous longitudinal distribution ensuring equal quantum well's carrier excitation. The total optical thickness of the active region from Bragg to air is 13/2 half-wave layers.

Such semiconductor element 200 is fabricated thanks to well-known semi-conductors fabrication technologies, such as Semiconductor Molecular Beam Epitaxy, Metal Organic Chemical Vapor Phase Deposition, electronic lithography, dry etching and wet etching. Any semiconductor materials may be used to fabricate such device according to the invention.

A second external mirror 206 with a concave shape is provided and arranged so as to form an external optical cavity with the first mirror 210 and to stabilize some transverse modes.

The external optical cavity is called "external" because it comprises a part which is distinct from the semi-conductor element. It doesn't need any extra component inside for the proper operation of the laser. Preferentially, its external part is filled with air, constituting the air gap 207, but in some other embodiments, the optical cavity of the laser device according to the invention may include a solid spacer between the exit region and the second mirror in order to form a monolithic cavity. As an example, such monolithic cavity could be made with a Saphir monolith or with glass.

In a preferred embodiment, the external cavity is centred on a centre-longitudinal axis of rotation.

The second mirror 206 may be a dielectric glass based mirror or may have some photonic crystals on semiconductor or etched surface. It has a few percent of transmittance so as to allow the laser beam to exit the laser. Typically, the second external mirror is located at few millimetres (typically 1 mm) from the semiconductor element, and it has a radius of curvature of few millimetres (typically about 10 mm). In the example illustrated in FIG. 2, an air gap 207 separates the concave shaped external mirror 206 from the semiconductor element 200.

Then, an optical pumping (not represented) is used to raise electrons from low energy levels to some higher excited ones thanks to a laser diode (or any optical coherent or incoherent source) or thanks to electrical injection. In a preferred embodiment, the optical pumping may be replaced with a single transverse-mode laser diode. As an example, the wavelength may be 785 nm and the output power 300 mW. The pumping laser beam is the focused onto the half-VECSEL external surface in order to provide a 50-100 μm spot-size.

In order to select one rotary-symmetrical transverse mode exhibiting an OAM, as for example one Laguerre-Gauss (LG) transverse mode between one of the $LG_{OM}$ set of modes (module of OAM $|M|\geq 1$), at least one means 204 for transverse filtering the optical wave is introduced into the optical cavity. In FIG. 2, it is located onto the gain exit region (i.e. on the top of the gain mirror) of the semiconductor element 200, but in a more general way, it may be preferentially located or closed to an antinode of the optical standing-wave.

The means for transverse filtering the optical wave 204 include many types of means for spatially filtering the optical standing-wave inside the optical cavity, as for example (i) means for diffracting light (like holes for example), (ii) means for diffusing light (like some rough etched semiconductor surface for example) and (iii) means for absorbing light (like a metallic mask for example), (iiii) means for generating local non uniform gain distribution.

Figure 3:
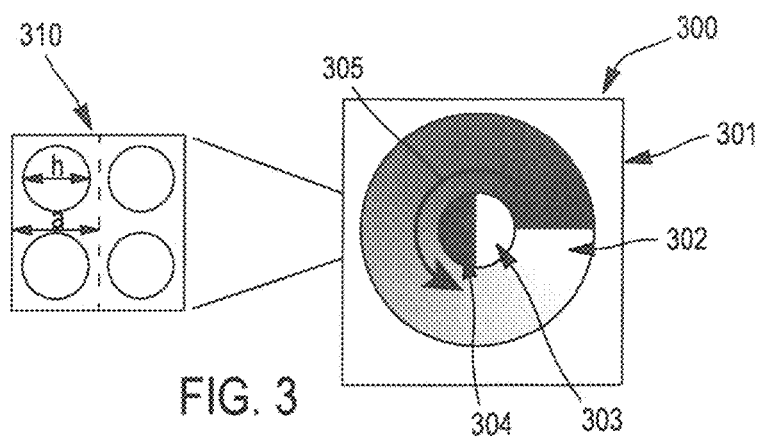
FIG. 3 is a schematic representation of the intensity/phase shaping mask according to the invention.

The means for transverse filtering the optical wave exhibit three functionalized surfaces described in FIG. 3 and that can be integrated onto one single element or distributed onto a plurality of elements.

As an example, the center-discoidal area may be deposited onto a first element and located at a first position while the annular area may be fabricated onto a second element and deposited onto a second position of the laser device.

Figure 7:
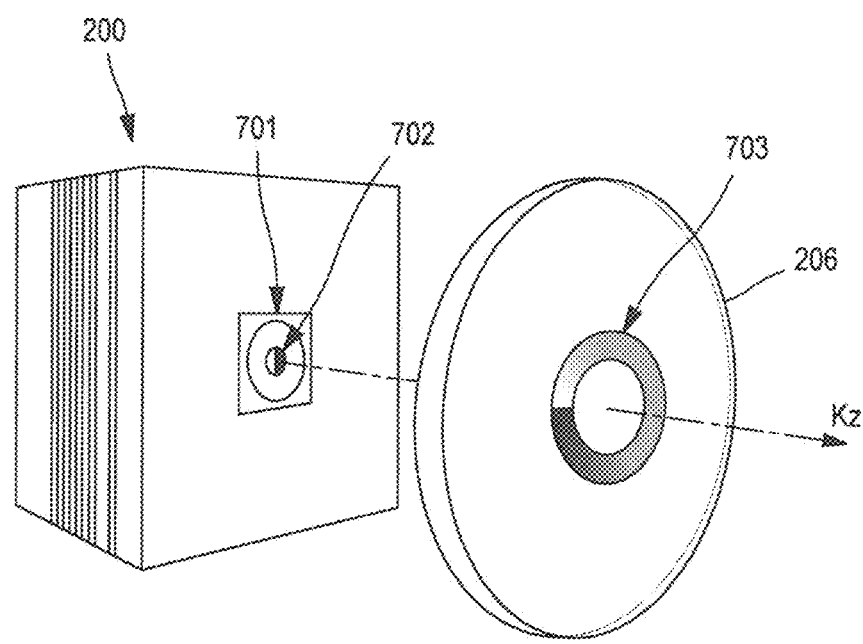
FIG. 7 describes a schematic view of a laser device according to the invention, implementing a plurality of means for transverse filtering the optical wave.

As illustrated in FIG. 7, both the center-discoidal area 702 and the absorbing area 701 may be deposited onto the first element 200 via two distinct masks, while the annular area 703 may be located onto the second mirror 206.

When the device according the invention is split with more than one element, one should be careful with the diffractive effects of the lasing optical wave inside the optical cavity: the lateral and azimuthal dimension of such elements should be adapted in order to take into account of the diffraction produced by the first element on the light, before reaching the second element.

In the mode of realization illustrated in FIG. 2, the means for transverse filtering the optical wave are of the type of one single flat photonic element including the three functionalized areas.

FIG. 3 illustrates a schematic representation of the intensity/phase transverse filtering element 300 according to the invention. It consists in a photonic crystal with a two dimensional sub-wavelength grating 310 made of a single $Si_3N_4$ layer perforated by a 2D array of holes with a diameter (h) and placed on a square grid, with a pitch(a).

The 2D grating 310 acts as a meta-material with a refractive index equal to the normalized propagation constant of fundamental Bloch mode. Thus, the refractive index of this meta-material can be controlled trough a careful control of the hole diameters (h), where tiny air holes correspond to a dense artificial dielectric with a large effective index close to the one of the bulk $Si_3N_4$ material, whereas large hole areas implement low refractive-index artificial dielectrics.

Three different areas have been designed providing three independent functions:
- a center-discoidal area 303 providing high diffraction losses between a minimum phase shift value and a maximum phase shift value,
- an annular area 302, located around the center-discoidal area 303 and providing graded phase in transmission with low diffraction losses, and
- a gain area 301, located on the peripheral region, outer from the annular area.

The first function provides high diffraction losses and is aligned with the longitudinal axis of the optical laser cavity, implemented by using an abrupt phase step 304. This particular topological effect allows selecting a given doughnut mode by putting this phase step in the dark region of this mode. Thus, all the modes excluding the desired one experience high diffraction losses. It also allows controlling the charge of the vortex mode, by changing either the cavity length and thereby the mode size or the high-losses area diameter to the other vortex modes with bigger dark core, and thus higher OAM charge. It is achieved with a two-state-grating: a first homogeneous sub-area 402 with some dimensional characteristics that lead to a minimum phase value, and a second homogeneous sub-area 401 with some other dimensional characteristics that lead to a maximum phase value.

The dimensional characteristics of the 2D grating flat photonic element will be described with FIG. 5. Hereafter, the term filling factor is used for tuning the dimensional characteristics of the 2D grating in order to obtain the desired de-phasing.

The second function is a perturbative spiral phase function with a graded-phase profile 302 designed in order to introduce a weak phase difference $\Delta m=2\pi/100$ for a complete turn around the longitudinal axis and to control the sign of the Orbital Angular Momentum (OAM), i.e., the direction of the helical wave-front rotation 305. It is implemented by smooth-azimuthally varying the filling factor (given by h/a). To introduce such a weak phase difference with good accuracy, the 2D grating layer 310 is put near a node of the electric field standing waves in the structure.

The third function is an additional filtering 503, 701 (visible onto FIG. 5 and FIG. 7) in order to prevent the other modes from lasing through the optical cavity. It aims at decreasing the magnitude of those modes, for example by attenuating its intensity thanks to absorption, diffraction, diffusion or local pumping.

Figure 4:
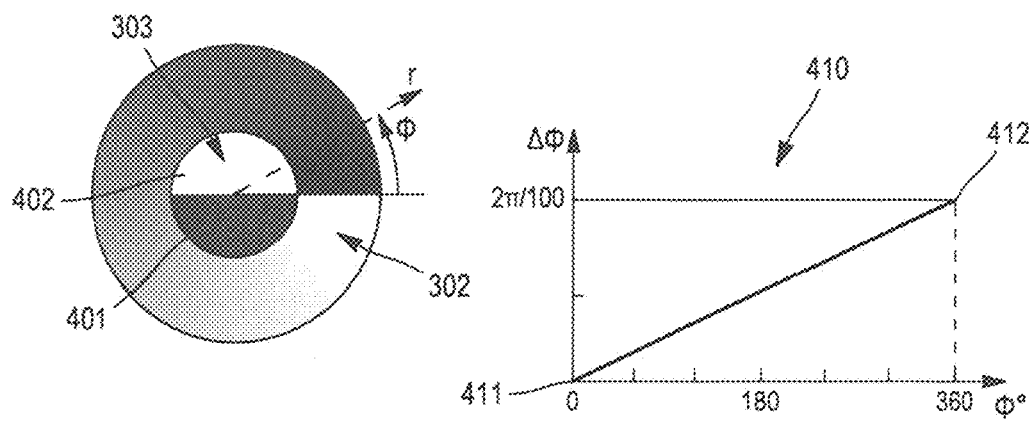
FIG. 4 is a schematic view of phase gradient provided along the annular area of the mask according to the invention.

In FIG. 3 and FIG. 4, the gray scale illustrates the dephasing value obtained with the device according to the invention.

FIG. 4 illustrates firstly the bi-phase center area 303 and secondly the phase gradient provided along the annular area 302 (called hereafter the Spiral Phase Element—SPE) of the flat photonic element according to one embodiment of the invention. The dephasing spreads between a minimum value 411 and a maximum value 412, and it is an object of the invention that the maximum value 412 is not too large in order not to over-perturb the optical wave that is lasing into the optical cavity. More precisely, the maximum dephasing value must be constraint to few percent of $2\pi$ radians.

In the mode of realization depicts in FIG. 4, the dephasing provided by the Spiral Phase Element 302 goes from 0 to $2\pi/100$.

The annular phase gradient aims at controlling the OAM's sign by weakly perturbing the cavity eigenbasis and making the laser resonator more favorable to maintain one rotation sign of the helical wave-front.

Indeed, vortex beams with higher OAM have larger spatial energy spread with bigger dark core. Thus vortex beam having helical wave-front with directions of rotation opposite to that of the Spiral Phase Element (SPE), experiences slight reduction of its OAM for every round-trip. As previously defined, this reduction is proportional to $\Gamma_{xy} \times \Delta m$, where $\Gamma_{xy}$ is the overlapping factor between the beam and the spiral phase element.

This is a fundamental issue for the flat photonic element according to the invention, because the reduction of the beam energy spread increases the overlapping with the SPE every round trip inside the optical cavity, which increases thereby the effect of the SPE on the beam. Then the beam is trapped in a recursive effect and is strongly perturbed, because as its energy spread and its dark region are narrowed, the mode is more affected by the phase-step in the center-discoidal area.

On the other hand, the vortex beam having helical wave-front with a direction of rotation that is similar to that of the Spiral Phase Element experiences a slight increase of its OAM every round trip inside the optical cavity, increasing its spatial spread and thus reducing the overlapping with the phase element. This explains why it is possible to observe a symmetry breakdown of the contra-rotating mode, initially degenerated.

Figure 5:
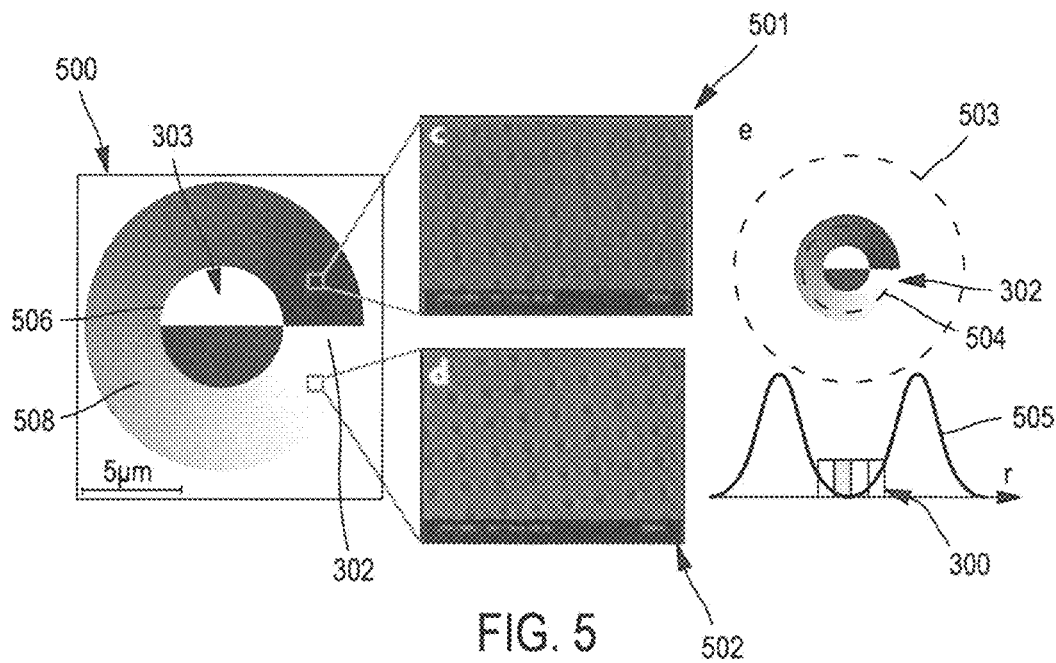
FIG. 5 is an optical microscope image of the flat-photonics element according to the invention.

FIG. 5 illustrates some optical microscope images of a fabricated flat-photonics element according to the invention. As described before, it consists in a 2D sub-wavelength grating based on a $\lambda/8$ thick $Si_3N_4$ layer deposited on the gain mirror by ion-beam-assisted electron-beam vacuum evaporation. Then a polymethyl methacrylate (PMMA) resin is spin-coated on the wafer and patterned by electron beam lithography. After PMMA development, the 2D grating holes are transferred to the SiN layer by Reactive Ion Etching, and then the PMMA is removed.

FIG. 5 depicts in 500 the center-discoidal area 303 and the annular area 302 integrating the sub-wavelength 2D grating 310 with the two phase functions visible. Two insets 501 and 502 illustrate the 2D grating for different locations around the Spiral Phase Element: the first inset 501 highlights a low filling factor that corresponds with a low effective refractive index, while the second inset 502 highlights a high filling factor that corresponds with a high effective refractive index. The 2D grating filling factor follows a smooth gradient between those two positions, in order to provide a smooth dephasing gradient, as illustrated in FIG. 4. To calculate the filling factor profile that gives the desired effective refractive index, the well-known rigorous coupled-wave analysis (RCWA) method is used.

Many dimensions may be realized for the grating and the holes, in order to be chosen according to the intensity profile of the targeted $LG_{OM}$ modes into the optical cavity. Typically, but not limiting to, the Spiral Phase Elements 302 may have an internal diameter 506 ranging from 6 microns to 10 microns and an external radius 507 of 20 microns regardless the direction of the rotation.

The 2D grating dimensional characteristics may be defined by Gaussian beam optics and can be calculated through the Gaussian beam parameter that is related to the waist and the radius of curvature of the wave front.

The Gaussian beam parameter must repeat after one round trip.

Once the Gaussian beam parameter is calculated for a given cavity length and the output mirror 206 radius of curvature is determined, the field distribution of the complete set of LG modes basis can be written and the suitable grating size can be chosen in order to select the desired mode. For example FIG. 5 schematically illustrates the electrical field profile 505 of the $LG_{01}$ mode for a 9.5 mm optical cavity length, with an overprinted 2D grating Spiral Phase Element 302 of 6 micron internal diameter. The dashed lines 503 and 504 illustrate respectively the inner and outer diameter of the doughnut shaped intensity profile for the helical mode obtained with such structure. It shows the space-dependence and the interaction of both dephasing areas and the electrical field of the helical optical wave.

Figure 6:
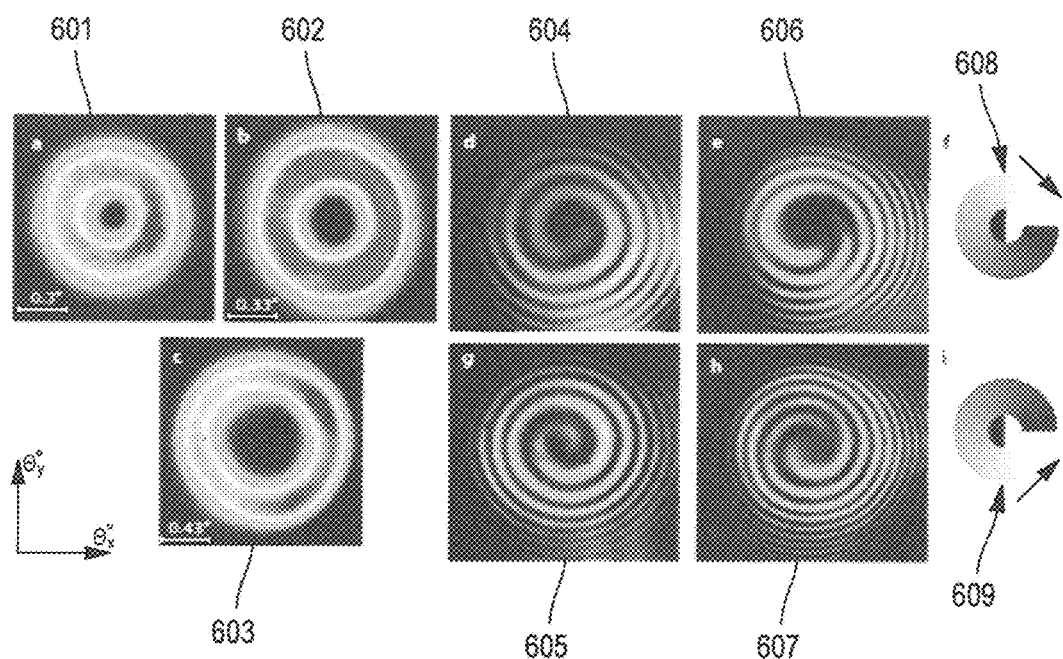
FIG. 6 describes some measured intensity profiles of LG modes having helical wave-front, and corresponding spiral interference fringes.

FIG. 6 is a measured image using 2D CCD camera that illustrates intensity profiles of Laguerre-Gauss modes having helical wave-front and obtained with a laser device according to the invention.

More precisely, FIG. 6 depicts in 601-603 the far field intensity profiles obtained with vortex modes of different orders, respectively $LG_{01}$, $LG_{02}$ and $LG_{03}$ in 601, 602 and 603, by using left-handed or right-handed Spiral Phase Elements as shown in 608 and 609.

The vortex direction of rotation controlling capability of the laser device according to the invention is demonstrated in pictures 604-607, wherein interference patterns have been measured, by interacting each of the generated beams with a spherical wave-front reference beam. Pictures 604 and 605 illustrate one-start spiral fringes corresponding to left and right handed $LG_{01}$ helicity respectively, with an OAM charge equal to 1. Pictures 606 and 607 illustrate two-start spiral fringes corresponding to left and right handed $LG_{02}$ helicity respectively, with an OAM charge equal to 2.

FIG. 6 illustrates some well-determined handedness spiral fringes, proving that the generated helical modes carry a single OAM with controlled charge and sign. Indeed, the spiral fringe handedness corresponds to the sign of the OAM, and the number of the starts of the fringes from the dark center corresponds to the charge of the OAM. Spiral fringes demonstrate that generated helical beams possess a well-defined single orbital angular momentum, which is well-known to be an indicator of its purity.

As a non-restrictive example, a complete example of realization will be now described hereafter, considering a Vortex laser with the following optical cavity parameters:

Cavity length: $L_C$=9650 µm

Radius of curvature of the concave mirror: $R_C$=10 mm

Optical Cavity losses (output coupler mirror transmission) : T=0.5%

Waist of the fundamental mode: $W_0$=24 µm

To control the charge of the Orbital Angular Momentum in order to be equal to 1, the fundamental mode and other high order modes are filtered using:

The diameter of the annular area (i.e. the SPE) is Φ=6.6 µm, located at 3% of the maximum of the wanted mode's intensity .

A limited pumping zone, with a diameter $W_{max}$=42 µm, corresponding with the waist of the wanted mode corresponding to a mode intensity of 13%.

Figure 10:
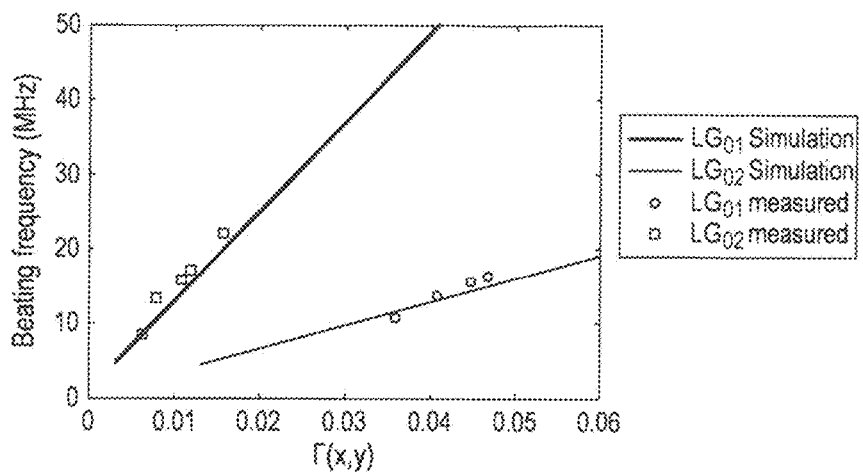
FIG. 10 is a graphic that illustrates the evolution of the beating frequency (resulting from the degeneracy lift) regarding the overlapping factor.

Then, to efficiently control, the sign of the Orbital Angular Momentum in a more robust way, the frequency splitting $\Delta v = C \times \Gamma(r, \theta) \times I^2 \times \Delta m$ must be greater than a fraction of the cutoff frequency of the optical cavity $f_c = FSR \times T/2\pi$, where:

Δm is the total phase difference on the Spiral Phase Element (2π/50 for example) per round trip, I is the OAM charge, C=2.4GHz/rad is a technological constant defined by the technology and driven by fitting experimental and theoretical curves, as defined in FIG. 10, in which the evolution of the beating frequency regarding the overlapping factor is described, with both some experimental results and some modeling results.

Figure 11:
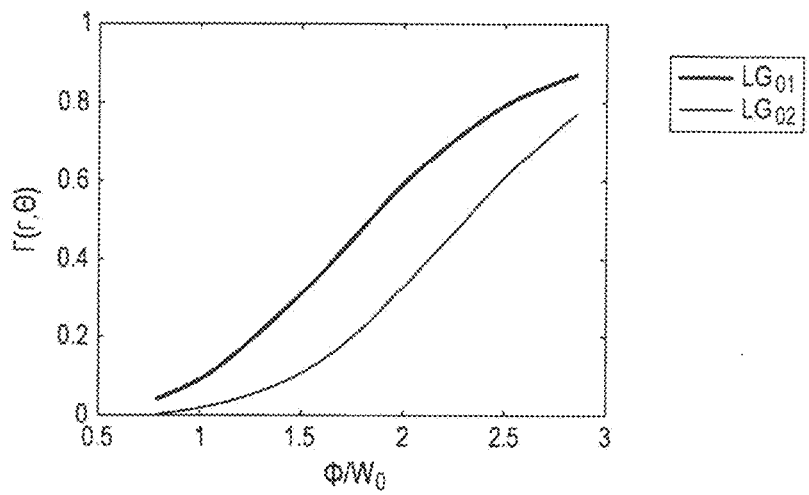
FIG. 11 is a graphic that illustrates the evolution of the overlapping factor regarding the ratio $\Phi/w_0$.

$\Gamma(r, \theta) = f(\phi/w_0)$ is the previously defined overlapping factor and depends on $\phi/w_0$ as illustrated in FIG. 11, in which the evolution of the overlapping factor regarding the ratio $\Phi/w_0$ is illustrated.

$w_0$ is the waist of the fundamental mode of the LG basis,

FSR is the Free Spectral Range of the optical cavity. Then, as already exposed, the Spiral Phase Element must induce a resultant modal phase shift comprised between $2\pi \cdot 10^{-5}$ and $2\pi/5$.

In this example of realization, the following values have been chosen in order to achieve a vortex laser according to the invention:

Δm=2π/50,

Φ=50 µm,

And it gives a modal phase shift of $6 \cdot 10^{-3}$ rad and a resultant optical frequency splitting of Δv=14.4 MHz for the $LG_{01}$ mode that is oscillating inside the cavity, while the cavity cutoff frequency is $f_c$=12 MHz.

Second Mode of Realization

Figure 8:
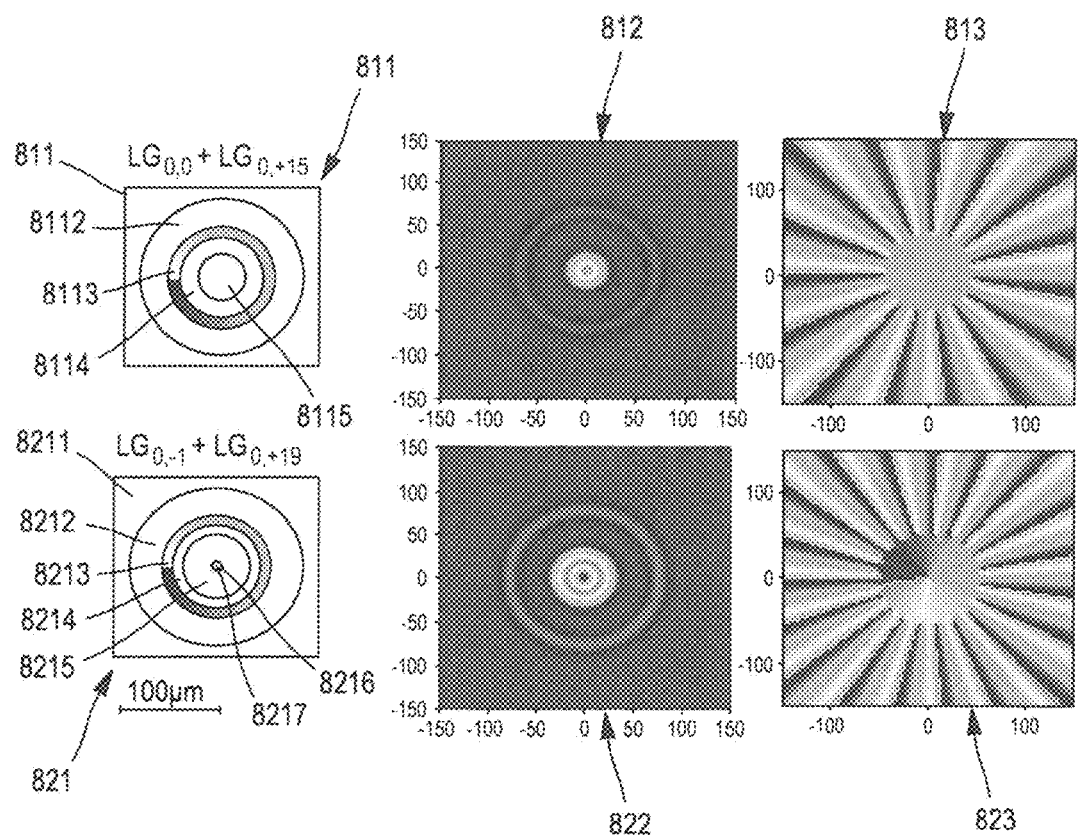
FIG. 8 describes two examples of means for filtering the optical wave in order to select two rotary-symmetrical transverse modes.

As described hereabove, the present invention also includes means for shaping the light intensity and/or phase profile in order to select more than one rotary-symmetrical transverse mode of the optical wave that is oscillating inside the optical cavity. FIG. 8 describes two examples 810 and 820 of this particular embodiment, wherein means for filtering the optical wave are designed in order to select two rotary-symmetrical transverse modes.

In the first example 810, the means for filtering the optical wave consists in a metallic mask with five functionalized areas:

a central area 8115 with no losses in order to transmit the fundamental mode, a first absorbing annular area 8114, a phase shifting annular area 8113, a transmitting annular area 8112 that does not induce losses onto the optical wave, and an absorbing peripheral area 8111.

As visible onto the intensity picture 812 and the phase picture 813, this mask is able to select two modes: $LG_{0,0}$ and $LG_{0,15}$ In the second example 820, the means for filtering the optical wave consists in a metallic mask with seven functionalized areas:

a central absorbing area 8217, a first phase shifting annular area 8216, a first transmitting annular area 8215, that does not induce losses onto the optical wave, those three first areas make it possible to select a first rotary-symmetrical transverse mode: the $LG_{0,-1}$;

an annular absorbing area 8214, a second phase shifting annular area 8213, a second transmitting annular area 8212, that does not induce losses onto the optical wave, those three second areas make it possible to select an another rotary-symmetrical transverse mode: the $LG_{0,19}$;

an absorbing peripheral area 8211.

As visible onto the intensity picture 822 and the phase picture 823, this mask is able to select two rotary-symmetrical transverse modes: $LG_{0,-1}$ and $LG_{0,19}$.

Third Mode of Realization

It is another object of the present invention to provide a single-vortex laser with multi-frequencies by using at least one wide optical bandwidth spectral filter. Typically, the laser linewidth can reach between the fiftieth to the fifth of the gain bandwidth at any cavity length and sharpness. Thus, in order to provide dual-frequency—or alternatively multi-frequency—single vortex mode with a given frequency difference, the gain bandwidth and/or the filter bandwidth may be chosen in such a way that the frequency difference is comprised between the fiftieth to the fifth of the gain bandwidth (respectively the filter bandwidth).

Figure 12:
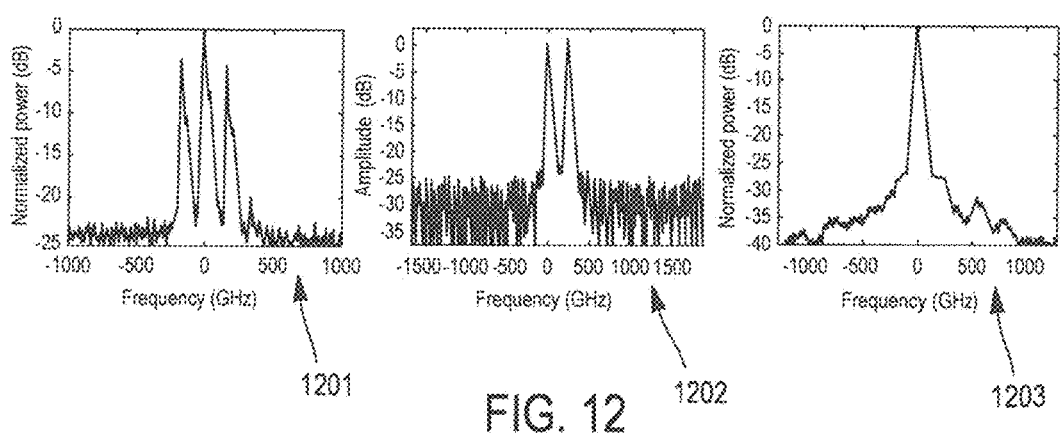
FIG. 12 describes two different examples of realization of single-vortex multi-frequency laser by illustrating its normalized optical spectrum.

Thus, as described in FIG. 12, it is possible with a vortex laser according to this third mode of realization to provide dual frequency single vortex laser from 10 GHz to 2 THz frequency difference and single frequency single vortex laser with a gain bandwidth lower than 1 THz.

More precisely, FIG. 12 illustrates the laser spectrum obtained with this third mode of realization of the invention: 1201 describes a tri-frequency vortex laser with a gain bandwidth of 6 THz that gives a frequency difference of 300 GHz; 1202 depicts a dual frequency vortex laser with a gain bandwidth of 6 THz giving a frequency difference of 240 GHz; and 1203 represents the laser spectrum of a single-frequency vortex laser with high side mode suppression ratio: the gain bandwidth is lower than 2 THz, giving a frequency difference significantly below its free spectral range.

Fourth Mode of Realization

In another mode of realization of the present invention, the at least one rotary-symmetrical transverse mode may be selected via a pumping laser beam that is patterned through an original design. Using this particular and non-homogeneous pumping pattern produces some equivalent effects onto the optical laser wave that is oscillating inside the optical cavity.

Figure 9:
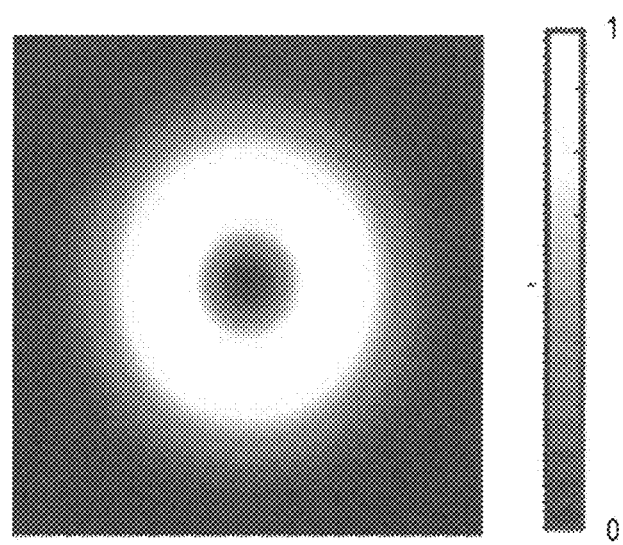
FIG. 9 is an intensity profile of a pumping laser beam used to select at least one rotary-symmetrical transverse mode of the optical wave in another mode of realization of the present invention.

FIG. 9 illustrates an intensity profile of a pumping laser beam used to select at least one rotary-symmetrical transverse mode of the optical wave: it's shaped in order to fit with the intensity profile of the sought transverse mode: the intensity profile of the pumping laser beam illustrated in FIG. 9 is like a "doughnut", as the intensity profile of the $LG_{0,1}$ already illustrated in FIG. 1.

In this particular mode of realization, the objective is to operate a "specialized magnification" of the optical wave that is oscillating inside the optical cavity. In contrast to the first mode of realization wherein at least one means for filtering the optical wave is used to induce some specific losses, and wherein the pumping is almost homogeneous in the central area (but is "cutting" the peripheral zone), this particular mode of realization implements an opposite approach: no losses are provided onto the optical wave, but a specific and non-homogeneous pumping is achieved in order to produce the same effect.

Thus, the pumping laser beam may be shaped by any means in order to produce a non-homogeneous pumping: only the areas corresponding with a sough rotary-symmetrical transverse mode are illuminated—and magnified—by the pumping laser beam.

Fifth Mode of Realization

In another mode of realization of the present invention, both the Orbital Angular Momentum charge and/or the sign of the at least one rotary-symmetrical transverse mode may be selected via an active control device.

To achieve such function, it's necessary to actively control the longitudinal optical path length of the optical cavity in order to modulate the OAM charge, and/or to actively control the azimuthal difference path length of the optical cavity in order to modulate the OAM sign.

As a non-restrictive example, a vortex laser corresponding to anyone of the previously detailed mode of realization may be achieved with at least one means for transverse filtering the optical wave (and more specifically its center-discoidal and annular areas) whose refractive index is modulable, or whose optical path length is modulable.

For example, it could be achieved by using an intracavity liquid crystal or any electrical, mechanical and/or thermal means for actively tuning the optical path length of the cavity and/or its refractive index, for example by using electro-optic modulators and/or local heat sources . . .)

More precisely, and each effect being independent from the other one, the longitudinal optical length modulation can be achieved with some mechanical actuators in order to change the cavity length, or also with some local heat sources in order to longitudinally change the refractive index; and/or the azimuthal optical length difference can be modulated thanks to some opto-electronic devices used to modify the Spiral Phase Element.

Thus the vortex Orbital Angular Momentum can be actively controlled, and the charge can be tuned through active change of cavity length, and its sign can be tuned through active change of SPE sign.

Sixth Mode of Realization

Figure 13:
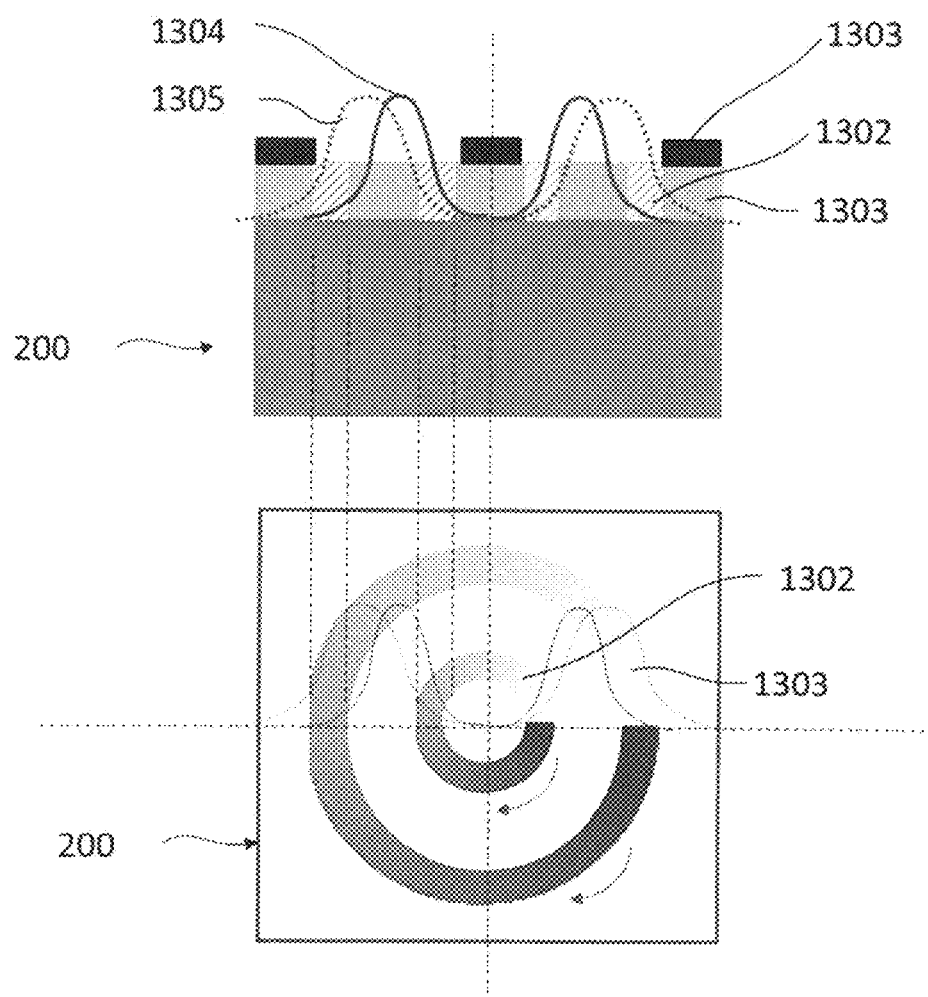
FIG. 13 describes a specific mode of realization of the invention, wherein the means for transverse filtering comprises two annular areas allowing beam charge sign control.

In another mode of realization of the present invention, depicted on the FIG. 13, the means for transverse filtering comprises two annular areas in order to make it possible to simply control the direction of rotation of the VORTEX beam by adjusting the beam waist.

FIG. 13 describes a schematic side view (top) and top view (bottom) of a device according to the invention, wherein two Spiral Phase Elements are designed in order to control the sign of the VORTEX beam.

The first element 200 is functionalized with a first SPE 1302 and a second SPE 1303 that is concentric with the first SPE 1302, and located around the first SPE 1302. For a first configuration, in which the beam waist is "low", as depicted through a solid curve 1304, the VORTEX beam may have a first direction of rotation; whereas for a second configuration in which the beam diameter is larger than one of the first configuration, as depicted through a dot curve 1305, the VORTEX beam may have an opposite direction of rotation.

The beam waist may be advantageously controlled by adjusting and controlling the length cavity and/or the radius of curvature of first 202 and/or second mirror 206.

The invention claimed is:

1. A laser device for generating a helical-shaped phase optical wave, the laser device comprising:
   a gain region located between one first end defined by a first mirror and a second end defined by an exit region;
   a second mirror configured to form, with the first mirror, an optical cavity including the gain region and a gap between the exit region and the second mirror;
   means for pumping the gain region so as to generate the optical wave;
   at least one means for transverse filtering the optical wave configured for selecting at least one rotary-symmetrical transverse mode of the optical wave, said rotary-symmetrical transverse mode being chosen among those with a radial index equal to zero and with an azimuthal index being an integer with a module higher or equal to 1; and the at least one means for transverse filtering the optical wave comprises the following functionalized areas:
a center-discoidal area providing high losses between a minimum phase shift value and a maximum phase shift value, and
a first annular area, located around the center-longitudinal axis and a second annular area located around the first annular area, wherein said first annular area and said second annular area each provide modal azimuthal graded phase shift; and
a functionalized absorbing area or pumping area, located on a peripheral region, which is outside of the first annular area.

2. The device according to claim 1, wherein the at least one means for transverse filtering the optical wave is centered on a longitudinal axis.

3. The device according to claim 1, wherein the center-discoidal area is divided onto two sub-areas, the first sub-area providing the minimum phase shift value, and the second sub-area providing the maximum phase shift value, said center-discoidal area providing modal losses.

4. The device according to claim 1, wherein the said first annular area provides at least one graduated perturbative spiral phase shift between the minimum phase shift value and the maximum phase shift value for at most one turn and for one roundtrip of the optical wave in the optical cavity, said first annular area providing a modal phase shift comprised between $2\pi*1\cdot10^{-5}$ and $2\pi/5$.

5. The device according to claim 1, wherein the at least one means for transverse filtering consists in one single mask located at or close to one of the following locations:
an antinode of the optical wave,
onto the gain region, and
onto the second mirror surface.

6. The device according to claim 1, wherein the at least one means for transverse filtering consists in a plurality of masks patterned with at least one functionalized area and at least one of the plurality of masks is located at or close to an antinode of the optical wave.

7. The device according to claim 1, wherein the at least one means for transverse filtering the optical wave is a flat photonic element fabricated using III-V semiconductor technology.

8. The device according to claim 1, wherein the phase shifts of the center-discoidal area and said first annular area are provided by refractive index variations of the at least one means for transverse filtering.

9. The device according to claim 1, wherein the phase shift values of said center-discoidal area and said first annular area are provided by controlling the 2D grating dimensional characteristics of the at least one means for transverse filtering.

10. The device according to claim 1, wherein the means for pumping the gain region comprise:
a pump laser emitting a pumping laser beam;
means arranged for spatially shaping the pumping laser beam intensity; and
the at least one means for shaping the light intensity and phase profiles of the optical wave comprise the means for spatially shaping the pumping laser beam intensity and are configured to project a pumping beam intensity pattern onto the exit region corresponding with the at least one selected rotary-symmetrical transverse mode of the optical wave.

11. The device according to claim 1, wherein the means for pumping the gain region consists in an electrical pumping of the gain region.

12. The device according to claim 1, wherein the laser device comprises a Vertical External Cavity Surface Emitting Laser.

13. The device according to claim 1, wherein the second mirror is a flat end mirror.

14. A method for generating a helical-shaped phase optical wave comprising the following steps:
generating an optical wave inside a gain region, said optical wave oscillating inside an optical cavity;
pumping the optical wave with means for pumping; and
shaping the light intensity and phase profiles of the optical wave for selecting at least one rotary-symmetrical transverse mode of the optical wave between those with a radial index equal to zero and with an azimuthal index being an integer with a module higher or equal to 1, by at least one means for transverse filtering the optical wave, which comprises:
providing high losses between a minimum phase shift value and a maximum phase shift value using a center-discoidal area, and
providing modal azimuthal graded phase shift using a first annular area, located around the center-longitudinal axis, and a second annular area, located around the first annular area; and
absorbing or pumping with a functionalized absorbing area or pumping area, located on a peripheral region, which is outside of the first annular area.

* * * * *